US010436872B2

(12) United States Patent
He

(10) Patent No.: US 10,436,872 B2
(45) Date of Patent: Oct. 8, 2019

(54) MAGNETIC RESONANCE SIGNAL CORRECTION

(71) Applicant: Jin Qiang He, Shenzhen (CN)

(72) Inventor: Jin Qiang He, Shenzhen (CN)

(73) Assignee: Siemens Aktiengesellschaft, München (DE)

( * ) Notice: Subject to any disclaimer, the term of this patent is extended or adjusted under 35 U.S.C. 154(b) by 688 days.

(21) Appl. No.: 14/587,963

(22) Filed: Dec. 31, 2014

(65) Prior Publication Data

US 2015/0185307 A1    Jul. 2, 2015

(30) Foreign Application Priority Data

Dec. 31, 2013  (CN) .......................... 2013 1 0750866

(51) Int. Cl.
   *G01V 3/00*     (2006.01)
   *G01R 33/565*   (2006.01)
   *G01R 33/36*    (2006.01)

(52) U.S. Cl.
   CPC ...... *G01R 33/5659* (2013.01); *G01R 33/3621* (2013.01)

(58) Field of Classification Search
   CPC ............ G01R 33/5659; G01R 33/3621; G01R 33/288; G01R 33/3415; G01R 33/3614; G01R 33/5612; G01R 33/583
   USPC ........................................................ 324/322
   See application file for complete search history.

(56) References Cited

U.S. PATENT DOCUMENTS

2010/0033180 A1*  2/2010  Biber ................. G01R 33/3415
                                                    324/309
2012/0256626 A1* 10/2012  Adalsteinsson .... G01R 33/5612
                                                    324/309

* cited by examiner

*Primary Examiner* — Rodney E Fuller
(74) *Attorney, Agent, or Firm* — Lempia Summerfield Katz LLC

(57) ABSTRACT

A magnetic resonance signal correction method, apparatus and system are provided. The method includes receiving a magnetic resonance signal through a radio frequency receiving channel, and correcting the magnetic resonance signal with a signal mapping relationship of the radio frequency receiving channel.

16 Claims, 5 Drawing Sheets

MAGNETIC RESONANCE SIGNAL CORRECTION

This application claims the benefit of CN 201310750866.X, filed on Dec. 31, 2013, which is hereby incorporated by reference in its entirety.

TECHNICAL FIELD

The present embodiments relate to the technical field of magnetic resonance imaging (MRI), and more specifically, to magnetic resonance signal correction.

BACKGROUND

Magnetic resonance imaging (MRI) is a bio-magnetic nuclear spin imaging technology developed rapidly along with the development of computer technology, electronic circuit technology, and superconductor technology. MRI allows precession hydrogen nuclei (e.g., H+) in a human tissue to carry out nutation by use of a magnetic field and a radio frequency (RF) pulse to generate a radio frequency signal, which is processed by a computer for imaging. When an object is placed in a magnetic field, the object is irradiated by an electromagnetic wave to make the object resonant. The released electromagnetic wave is analyzed to obtain locations and types of the nuclei constituting the object to thereby create a precise stereoscopic image of the interior of the object (e.g., an animation of consecutive slices, from the top to the base, of a human brain by scanning by magnetic resonance imaging).

During a magnetic resonance imaging test, magnetic resonance signals of the object under test are routed through a radio frequency receiving channel, such as a cable or an A/D converter, and finally reconstructed in a computing unit to form a magnetic resonance (MR) image for medical use. The radio frequency receiving channel may refer to a radio frequency channel between a receiving coil and a receiver in a magnetic resonance imaging apparatus. The radio frequency receiving channel is an important channel in a signal link, and attributes of the radio frequency receiving channel have a significant influence on image quality.

However, the non-linear features of the radio frequency receiving channel will cause distortion of magnetic resonance signals, and have a negative effect on the image quality of the magnetic resonance image. Since magnetic resonance signals are generally very weak, some switchable amplifiers may be installed in the radio frequency receiving channel, and will further deteriorate the non-linear features of the radio frequency receiving channel.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a magnetic resonance signal correction method is provided to reduce non-linear features of a channel and improve the imaging quality of a magnetic resonance image.

One or more of the present embodiments provide a magnetic resonance signal correction apparatus to reduce the non-linear features of a channel and improve the imaging quality of a magnetic resonance image.

An embodiment provides a magnetic resonance imaging system to reduce the non-linear features of a channel and improve the imaging quality of a magnetic resonance image.

A magnetic resonance signal correction method includes receiving a magnetic resonance signal through a radio frequency receiving channel, and correcting the magnetic resonance signal with a signal mapping relationship of the radio frequency receiving channel. The signal mapping relationship is a signal mapping relationship storage table. The signal mapping relationship storage table correspondingly stores a receiving value and a sending value of each test signal. The method also includes correcting the magnetic resonance signal with a signal mapping relationship, which includes retrieving a test signal receiving value identical with a receiving value of the magnetic resonance signal from the signal mapping relationship storage table, and querying a test signal sending value corresponding to the test signal receiving value with the signal mapping relationship storage table.

In one embodiment, the signal mapping relationship is a signal mapping relationship function, where the signal mapping relationship function defines a correlation between a receiving value and a sending value of each test signal. Correcting the magnetic resonance signal with a signal mapping relationship includes calculating a sending value of the magnetic resonance signal corresponding to a receiving value of the magnetic resonance signal according to the signal mapping relationship function.

In one embodiment, the method also includes receiving an assessment signal group through the radio frequency receiving channel. The assessment signal group contains at least two assessment signals having sending values. The method includes recording a receiving value of each assessment signal, correcting the receiving value of each assessment signal with the signal mapping relationship to obtain a correction value of each assessment signal, and determining a deviation value between the correction value of each assessment signal and the corresponding sending value. An alarm prompt message is sent when a maximum deviation value is greater than a preset standard value.

In one embodiment, the signal mapping relationship of the radio frequency receiving channel includes a magnitude mapping relationship and/or a phase mapping relationship. Correcting the magnetic resonance signal with a signal mapping relationship includes correcting the magnitude of the magnetic resonance signal with the magnitude mapping relationship and/or correcting the phase of the magnetic resonance signal with the phase mapping relationship.

Further included are receiving a test signal group through the radio frequency receiving channel. The test signal group includes at least two test signals having a sending value, respectively. The method includes recording a receiving value of each test signal, and establishing the signal mapping relationship of the radio frequency receiving channel according to the sending value and the receiving value of each test signal.

Establishing the signal mapping relationship of the radio frequency receiving channel includes setting a signal mapping relationship storage table, where the signal mapping relationship storage table correspondingly stores a receiving value and a sending value of each test signal, or fitting a signal mapping relationship function. The signal mapping relationship function defines a correlation between the receiving value and the sending value of each test signal.

The test signal is a Singh function.

A magnetic resonance signal correction apparatus includes a magnetic resonance signal receiving unit and a correction unit. The magnetic resonance signal receiving unit is used for receiving a magnetic resonance signal through a radio frequency receiving channel. The correction unit is used for correcting the magnetic resonance signal with a signal mapping relationship of the radio frequency receiving channel.

The signal mapping relationship is a signal mapping relationship storage table. The signal mapping relationship storage table correspondingly stores a receiving value and a sending value of each test signal. The correction unit is used for retrieving a test signal receiving value identical with a receiving value of the magnetic resonance signal from the signal mapping relationship storage table, and querying a test signal sending value corresponding to the test signal receiving value with the signal mapping relationship storage table.

The signal mapping relationship is a fitted signal mapping relationship function. The signal mapping relationship function defines a correlation between a receiving value and a sending value of each test signal. The correction unit is used for calculating a sending value of the magnetic resonance signal corresponding to a receiving value of the magnetic resonance signal according to the signal mapping relationship function.

In one or more of the present embodiments, an assessment unit is provided. The assessment unit is used for receiving an assessment signal group through the radio frequency receiving channel. The assessment signal group contains at least two assessment signals having sending values. The assessment unit is also used for recording a receiving value of each assessment signal, and correcting the receiving value of each assessment signal with the signal mapping relationship to obtain a correction value of each assessment signal. The assessment unit is used for determining a deviation value between the correction value of each assessment signal and the corresponding sending value, and sending an alarm prompt message when a maximum deviation value is greater than a preset standard value.

The signal mapping relationship of the radio frequency receiving channel includes a magnitude mapping relationship and/or a phase mapping relationship. The correction unit is used for correcting the magnitude of the magnetic resonance signal with the magnitude mapping relationship and/or correcting the phase of the magnetic resonance signal with the phase mapping relationship.

The magnetic resonance signal receiving unit is used for receiving a test signal group through the radio frequency receiving channel, where the test signal group includes at least two test signals having a sending value, respectively. The magnetic resonance signal receiving unit is used for recording a receiving value of each test signal, and the correction unit is used for establishing the signal mapping relationship of the radio frequency receiving channel according to the sending value and the receiving value of each test signal.

The correction unit is used for setting a signal mapping relationship storage table, where the signal mapping relationship storage table correspondingly stores a receiving value and a sending value of each test signal, or fitting a signal mapping relationship function. The signal mapping relationship function defines a correlation between the receiving value and the sending value of each test signal.

A magnetic resonance imaging system includes a receiving coil, a receiver and a computing unit. A radio frequency receiving channel is formed between the receiving coil and the receiver. The receiver is used for receiving a test signal group through the radio frequency receiving channel. The test signal group contains at least two test signals having a sending value, respectively. The receiver is used for recording a receiving value of each test signal. The computing unit is used for establishing a signal mapping relationship of the radio frequency receiving channel according to the sending value and the receiving value of each test signal. The receiver is further used for receiving a magnetic resonance signal from the receiving coil through the radio frequency receiving channel. The computing unit is further used for correcting the magnetic resonance signal with the signal mapping relationship.

In one or more of the present embodiments, a magnetic resonance signal is received through a radio frequency receiving channel, and the magnetic resonance signal is corrected with a signal mapping relationship of the radio frequency receiving channel. Thus, the embodiments may be used to describe the signal receiving attributes of a radio frequency receiving channel based on a signal mapping relationship of the radio frequency receiving channel determined by a test signal, and correct a magnetic resonance signal with the signal mapping relationship. The linear features of the radio frequency receiving channel may thus be optimized, reducing the non-linear features of the channel, and improving the imaging quality of a magnetic resonance image.

DETAILED DESCRIPTION

The present embodiments will be further described in detail in conjunction with the accompanying drawings. Specific embodiments described here are merely used for illustrating and are not intended to limit the scope of protection of the present invention.

In one or more of the present embodiments, a magnetic resonance signal is received through a radio frequency receiving channel, and the magnetic resonance signal is corrected with a signal mapping relationship of the radio frequency receiving channel.

In an embodiment, the signal mapping relationship may be a signal mapping relationship storage table, where the signal mapping relationship storage table correspondingly stores a receiving value and a sending value of each test signal. Correcting the magnetic resonance signal with a signal mapping relationship includes, for example, retrieving a test signal receiving value identical with a receiving value of the magnetic resonance signal from the signal mapping relationship storage table, and querying a test signal sending value corresponding to the test signal receiving value with the signal mapping relationship storage table.

In an embodiment, the signal mapping relationship is a signal mapping relationship function, where the signal mapping relationship function defines a correlation between a receiving value and a sending value of each test signal. Correcting the magnetic resonance signal with a signal mapping relationship includes, for example, calculating a sending value of the magnetic resonance signal corresponding to a receiving value of the magnetic resonance signal according to the signal mapping relationship function.

In an embodiment, an assessment signal group is received through the radio frequency receiving channel, where the assessment signal group includes at least two assessment signals having sending values, and a receiving value of each assessment signal is recorded. The receiving value of each assessment signal is corrected with the signal mapping relationship, to obtain a correction value of each assessment signal. A deviation value between the correction value of each assessment signal and the corresponding sending value is determined, and an alarm prompt message is sent when a maximum deviation value is greater than a preset standard value.

In an embodiment, the signal mapping relationship of the radio frequency receiving channel includes a magnitude mapping relationship and/or a phase mapping relationship. Correcting the magnetic resonance signal with a signal mapping relationship includes, for example, correcting the magnitude of the magnetic resonance signal with the magnitude mapping relationship and/or correcting the phase of the magnetic resonance signal with the phase mapping relationship.

Figure 1:
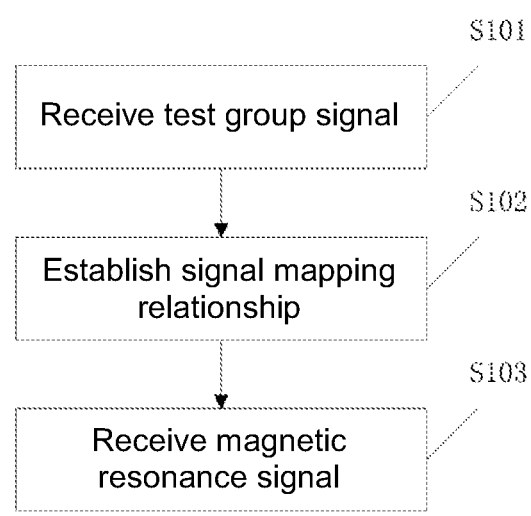
FIG. 1 is a flowchart of one embodiment of a method for establishing a signal mapping relationship and correcting a magnetic resonance signal.

FIG. 1 is a flowchart of one embodiment of a method for establishing a signal mapping relationship of a radio frequency receiving channel and correcting a magnetic resonance signal.

As shown in FIG. 1, the method includes act S101, in which a test signal group is received through the radio frequency receiving channel. The test signal group includes at least two test signals having a sending value, respectively, and a receiving value of each test signal is recorded.

The radio frequency receiving channel refers to a radio frequency channel between a receiving coil and a receiver in a magnetic resonance imaging apparatus. The receiving coil receives human body magnetic resonance signals and sends the magnetic resonance signals to the receiver through the radio frequency receiving channel. A computing unit connected to the receiver reconstructs the magnetic resonance signals to form a magnetic resonance image for medical use.

The radio frequency receiving channel may include components such as cables, A/D converters, and switchable amplifiers. For describing the signal receiving attributes of the radio frequency receiving channel and facilitating the correction of the non-linear attributes of the radio frequency receiving channel, before the magnetic resonance signal is received, a test signal group is received through the radio frequency receiving channel. The test signal group includes at least two test signals having a sending value (e.g., theoretical value), respectively. A receiving value of each test signal that is received through the radio frequency receiving channel is recorded.

In one embodiment, the test signal is a Singh (sinc) function, where the Singh function is a product of a sine function and a monotone decreasing function 1/x. The test signal group may be a series of Singh waves, and the magnitudes of the Singh waves are linearly increasing from 0 to a maximum value. At the receiving end of the radio frequency receiving channel, each of the received Singh waves is processed by normalization, the magnitude of the middle column of each Singh wave is measured as a magnitude receiving value of the Singh wave, and the phase of the middle column of each Singh wave is measured as a phase receiving value of the Singh wave.

The detailed description above uses a Singh function as an instance of the test signal. A person skilled in the art would appreciate that this description is merely exemplary, and is not intended to limit the scope of protection of the present invention.

Act S102 includes establishing a signal mapping relationship of the radio frequency receiving channel according to a sending value and a receiving value of each test signal.

In an embodiment, a signal mapping relationship storage table may be set, where the signal mapping relationship storage table correspondingly stores a sending value and a receiving value of each test signal. A signal mapping relationship of the radio frequency receiving channel may be established through the signal mapping relationship storage table.

The more sending values and corresponding receiving values stored in the mapping relationship storage table, the more comprehensive the signal mapping relationship of the radio frequency receiving channel is.

In an embodiment, a signal mapping relationship function may be further fitted, where the signal mapping relationship function defines a correlation between a receiving value and a sending value of each test signal. Specifically, a discrete point set including the sending value and the receiving value of each test signal may be established, and a continuous function defined on a continuous set may be fitted based on the discrete point set. The discrete point set is included in the continuous set.

For example, assuming that the discrete point set is $\{f1, f2, \ldots, fn\}$, a plurality of undetermined coefficients $f(\lambda 1, \lambda 2, \ldots, \lambda n)$ in the fitting function are adjusted, so that the difference (e.g., the least square value) between the fitting function and the discrete point set is minimum. If the fitting function is linear, linear fitting or linear regression is provided. Otherwise, non-linear fitting or non-linear regression is provided. The expression of fitting function may be a piecewise function (e.g., spline fitting).

Although some fitting algorithms are described above in detail, a person skilled in the art would appreciate that this listing is merely exemplary, and is not intended to limit the scope of protection of the present invention.

Thus, the signal receiving attributes of a radio frequency receiving channel are described based on a signal mapping relationship of the radio frequency receiving channel determined by a test signal, and correction for a magnetic resonance signal with the signal mapping relationship may be carried out subsequently.

Act S103 includes receiving a magnetic resonance signal through the radio frequency receiving channel, and correcting the magnetic resonance signal with the signal mapping relationship.

Determining the signal mapping relationship of the radio frequency receiving channel is equivalent to determining the non-linear attributes of the radio frequency receiving channel. The magnetic resonance signal may be corrected with the signal mapping relationship.

For example, when the signal mapping relationship is reflected through the signal mapping relationship storage table, a test signal receiving value identical with a receiving value of the magnetic resonance signal may be retrieved from the signal mapping relationship storage table. A magnetic resonance image may be reconstructed with the test signal sending value corresponding to the test signal receiving value. This method for determining a corrected magnetic resonance signal by looking up a table has advantages of simple implementation and easy querying.

For another example, when the signal mapping relationship is a fitted signal mapping relationship function, a sending value of the magnetic resonance signal corresponding to the receiving value of the magnetic resonance signal may be calculated according to the signal mapping relationship function, and a magnetic resonance image may be reconstructed with the sending value of the magnetic resonance signal. In other words, when the signal mapping relationship is reflected through a continuous function, the receiving value of the magnetic resonance signal may be corrected according to the continuous function, and a magnetic resonance image may be reconstructed with the corrected magnetic resonance signal.

Given that the continuous function is f(x), the independent variable thereof is a signal sending value x, and the function value is a signal receiving value. An inverse function of f(x), $f^1(x)$, is calculated, where the independent variable of $f^1(x)$ is a signal receiving value. The received magnetic resonance signal is substituted into the expression $f^1(x)$, so that the corrected magnetic resonance signal may be determined.

After the magnetic resonance signal is corrected, the corrected magnetic resonance signal may be filled into a space K in magnetic resonance imaging, and a magnetic resonance image is formed.

When the test signal is a Singh function, the signal mapping relationship of the radio frequency receiving channel includes a magnitude mapping relationship and/or a phase mapping relationship. The magnitude of the magnetic resonance signal may be corrected with the magnitude mapping relationship, and/or the phase of the magnetic resonance signal may be corrected with the phase mapping relationship.

In an embodiment, the correction effect of the radio frequency receiving channel is further assessed.

The method further includes receiving an assessment signal group through the radio frequency receiving channel, where the assessment signal group includes at least two assessment signals having sending values, and recording a receiving value of each assessment signal. The method also includes correcting the receiving value of each assessment signal with the signal mapping relationship, to obtain a correction value of each assessment signal, and determining a deviation value between the correction value of each assessment signal and the corresponding sending value. The method includes sending an alarm prompt message when a maximum deviation value is greater than a preset standard value.

In one embodiment, the assessment signal is a Singh function, and the magnitude of the Singh waves is linearly increasing from 0 to a maximum value. When the correction effect of the radio frequency receiving channel is assessed with Singh waves, magnitude correction assessment and phase correction assessment may be performed.

For magnitude correction assessment, at the receiving end of the radio frequency receiving channel, each of the received Singh waves is processed by normalization, the magnitude of the middle column of each Singh wave is measured to obtain a magnitude receiving value of the Singh wave, and a deviation value of the magnitude receiving value of each Singh wave is calculated according to linear regression. The maximum deviation value in each Singh wave is compared with a preset standard value (for example, 10%). When the maximum deviation value is greater than the standard value, it is determined that magnitude correction has a poor effect, and an alarm prompt message is sent out.

For phase correction assessment, at the receiving end of the radio frequency receiving channel, each of the received Singh waves is processed by normalization, and the magnitude of the middle column of each Singh wave is measured to obtain a magnitude receiving value of the Singh wave. Since the phase values of all Singh waves are the same theoretically, only the actually measured maximum and minimum phase values, and the difference between the maximum and minimum phase values may be calculated. The difference is compared with a preset standard value. When the maximum difference is greater than the preset standard value, it is determined that phase correction has a poor effect, and an alarm prompt message is sent out.

Figure 2:
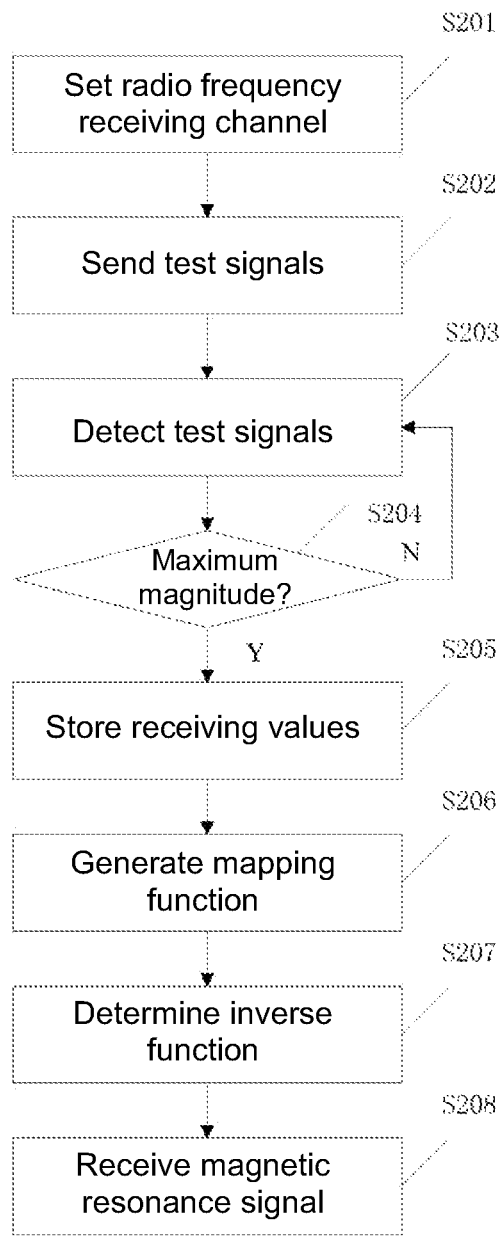
FIG. 2 is a flowchart of one embodiment of a method for correcting a radio frequency receiving channel using a Singh function as a test signal.

Based on the discussion above, FIG. 2 is a flowchart of one embodiment of a method for correcting a radio frequency receiving channel using a Singh function as a test signal.

As shown in FIG. 2, the method includes act Step S201, in which a radio frequency receiving channel is set, a radio frequency signal transmitter is started at a sending end of the radio frequency receiving channel, and a radio frequency signal receiver is started at a receiving end of the radio frequency receiving channel.

In act S202, the radio frequency signal transmitter sends a series of test signals with linearly increasing magnitude.

In act S203, the radio frequency signal receiver detects the test signal through the radio frequency receiving channel.

In act S204, it is determined whether the magnitude of the test signal reaches a maximum value or not. If yes, act S205 and the subsequent acts are executed. Otherwise, the method returns to act S203 to be executed.

Act S205 includes storing the receiving values of all test signals received by the radio frequency signal receiver in a database.

Act S206 includes generating a mapping function between the test signal receiving value and the test signal sending value.

Act S207 includes determining an inverse function of the mapping function, so that the non-linear effect of the radio frequency receiving channel may be determined.

Act S208 includes receiving a magnetic resonance signal using the radio frequency receiving channel, and correcting the magnetic resonance signal based on the inverse function of the mapping function.

Figure 3:
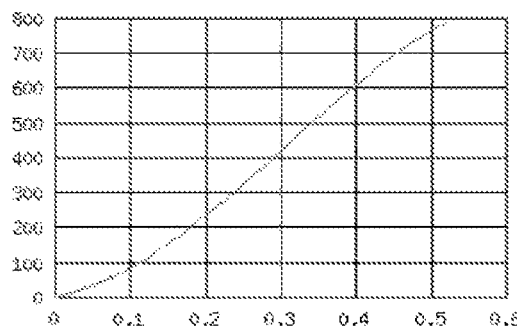
FIG. 3 is a schematic diagram of an exemplary magnitude assessment using a Singh function as an assessment signal.

FIG. 3 is a schematic diagram of magnitude assessment using a Singh function as an assessment signal according to an embodiment.

In FIG. 3, the horizontal axis is an input value of the assessment signal (e.g., assessment signal sending value) and is a normalized assessment signal sending value in this example. The vertical axis is a receiving value of the assessment signal and has a unit of volt. FIG. 3 shows that the magnitude value curve is substantially a straight line (e.g., the magnitude substantially represents a linear feature), and thus, magnitude assess is qualified.

Figure 4:
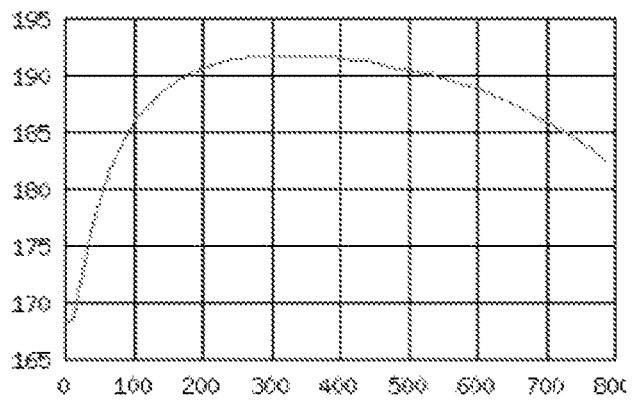
FIG. 4 is a schematic diagram of an exemplary phase assessment using a Singh function as an assessment signal.

FIG. 4 is a schematic diagram of phase assess using a Singh function as an assessment signal according to an embodiment.

In FIG. 4, the horizontal axis is a receiving value of the assessment signal and has a unit of volt. The vertical axis is a phase value of the assessment signal, and has a unit of degree. FIG. 4 shows that the phase value curve is significantly not a straight line in a range of 0-200 in horizontal axis coordinates (e.g., the phase is not a fixed value), and therefore, phase assess is unqualified in this stage. An alarm prompt message is sent to remind a user to check the hardware of the radio frequency receiving channel.

Based on the above-mentioned detailed analysis, an embodiment also provides an apparatus for establishing a signal mapping relationship.

Figure 5:
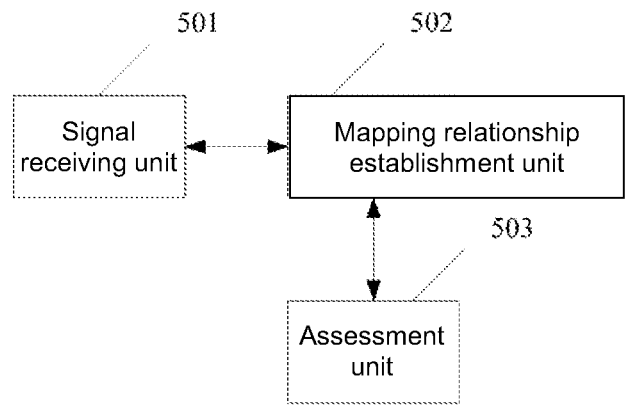
FIG. 5 is a structural diagram of one embodiment of an apparatus for establishing a signal mapping relationship.

FIG. 5 is a structural diagram of an apparatus for establishing a mapping relationship of a radio frequency receiving channel according to an embodiment.

As shown in FIG. 5, the apparatus includes a signal receiving unit 501 and a mapping relationship establishment unit 502. The signal receiving unit 501 is used for receiving a test signal group through a radio frequency receiving channel. The test signal group includes at least two test signals having a sending value respectively. The signal receiving unit 501 is also used for recording a receiving value of each test signal. The mapping relationship establishment unit 502 is used for establishing a signal mapping relationship of the radio frequency receiving channel according to the sending value and the receiving value of each test signal.

In an embodiment, the mapping relationship establishment unit 502 is used for setting a signal mapping relationship storage table. The signal mapping relationship storage table correspondingly stores a receiving value and a sending value of each test signal. Alternatively, the mapping relationship establishment unit 502 is used for fitting a signal mapping relationship function. The signal mapping relationship function defines a correlation between the receiving value and the sending value of each test signal.

The mapping relationship establishment unit 502 fitting the signal mapping relationship function may specifically include establishing a discrete point set including the sending value and the receiving value of each test signal, and fitting a continuous function defined on a continuous set (e.g., a signal mapping relationship function) based on the discrete point set. The discrete point set contains the continuous set.

In an embodiment, further included is an assessment unit 503.

The assessment unit 503 is used for receiving an assessment signal group through the radio frequency receiving channel. The assessment signal group includes at least two assessment signals having sending values. The assessment unit 503 is also used for recording a receiving value of each assessment signal, and correcting the receiving value of each assessment signal with the signal mapping relationship to obtain a correction value of each assessment signal. The assessment unit 503 is used for determining a deviation value between the correction value of each assessment signal and the corresponding sending value, and sending an alarm prompt message when a maximum deviation value is greater than a preset standard value.

Based on the discussion above, one or more of the present embodiments provide a magnetic resonance signal correction apparatus.

The correction apparatus comprises a magnetic resonance signal receiving unit and a correction unit. The magnetic resonance signal receiving unit is used for receiving a magnetic resonance signal through a radio frequency receiving channel; and the correction unit is used for correcting the magnetic resonance signal with a signal mapping relationship of the radio frequency receiving channel.

In an embodiment, the signal mapping relationship is a signal mapping relationship storage table, wherein the signal mapping relationship storage table correspondingly stores a receiving value and a sending value of each test signal. The correction unit is used for retrieving a test signal receiving value identical with a receiving value of the magnetic resonance signal from the signal mapping relationship storage table, and querying a test signal sending value corresponding to the test signal receiving value with the signal mapping relationship storage table.

In an embodiment, the signal mapping relationship is a fitted signal mapping relationship function, wherein the signal mapping relationship function defines a correlation between a receiving value and a sending value of each test signal. The correction unit is used for calculating a sending value of the magnetic resonance signal corresponding to the receiving value of the magnetic resonance signal according to the signal mapping relationship function.

In an embodiment, further comprised is an assessment unit. The assessment unit is used for receiving an assessment signal group through the radio frequency receiving channel, wherein the assessment signal group contains at least two assessment signals having sending values, and recording a receiving value of each assessment signal; correcting the receiving value of each assessment signal with the signal mapping relationship, to obtain a correction value of each assessment signal; and determining a deviation value between the correction value of each assessment signal and the corresponding sending value, and sending an alarm prompt message when a maximum deviation value is greater than a preset standard value.

In an embodiment, the signal mapping relationship of the radio frequency receiving channel comprises a magnitude mapping relationship and/or a phase mapping relationship. The correction unit is used for correcting the magnitude of the magnetic resonance signal with the magnitude mapping relationship; and/or correcting the phase of the magnetic resonance signal with the phase mapping relationship.

Based on the analysis above, the magnetic resonance signal correction apparatus proposed in the present invention may be implemented in various manners.

Figure 6:
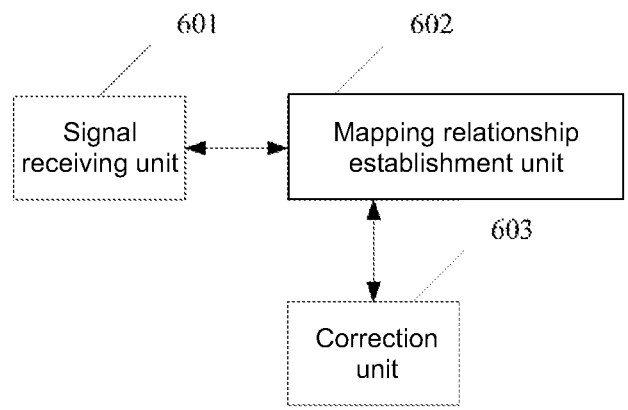
FIG. 6 is a structural diagram of one embodiment of an apparatus for correcting a magnetic resonance signal.

FIG. 6 is a structural diagram of an apparatus for correcting a magnetic resonance signal according to an embodiment.

As shown in FIG. 6, included are a signal receiving unit 601, a mapping relationship establishment unit 602, and a correction unit 603. The signal receiving unit 601 is used for receiving a test signal group through a radio frequency receiving channel, where the test signal group includes at least two test signals having a sending value, respectively, and recording a receiving value of each test signal. The mapping relationship establishment unit 602 is used for establishing a signal mapping relationship of the radio frequency receiving channel according to the sending value and the receiving value of each test signal.

The correction unit 603 is used for receiving a magnetic resonance signal through the radio frequency receiving channel, and correcting the magnetic resonance signal with the signal mapping relationship.

In an embodiment, the mapping relationship establishment unit 602 is used for setting a signal mapping relationship storage table, where the signal mapping relationship storage table correspondingly stores a receiving value and a sending value of each test signal. The correction unit 603 is used for retrieving a test signal receiving value identical with a receiving value of the magnetic resonance signal from the signal mapping relationship storage table, and reconstructing a magnetic resonance image with the test signal sending value corresponding to the test signal receiving value in the signal mapping relationship storage table.

In an embodiment, the mapping relationship establishment unit 602 is used for fitting a signal mapping relationship function. The signal mapping relationship function defines a correlation between a receiving value and a sending value of each test signal. For example, the mapping relationship establishment unit 602 is used for establishing a discrete point set containing the sending value and the receiving value of each test signal, and fitting a continuous function defined on a continuous set based on the discrete point set. The discrete point set is contained in the continuous set, and the correction unit 503 is used for calculating a sending value of the magnetic resonance signal corresponding to the receiving value of the magnetic resonance signal according to the signal mapping relationship function. The correction unit 503 is also used for reconstructing a magnetic resonance image with the sending value of the magnetic resonance signal.

In an embodiment, further included is an assessment unit (not shown in the figure).

The assessment unit is used for receiving an assessment signal group through the radio frequency receiving channel. The assessment signal group includes at least two assessment signals having sending values. The assessment unit is also used for recording a receiving value of each assessment signal and correcting the receiving value of each assessment signal with the signal mapping relationship to obtain a correction value of each assessment signal. The assessment unit is used for determining a deviation value between the correction value of each assessment signal and the corresponding sending value, and sending an alarm prompt message when a maximum deviation value is greater than a preset standard value.

In an embodiment, the test signal is a Singh function.

In an embodiment, the signal mapping relationship of the radio frequency receiving channel includes a magnitude mapping relationship and/or a phase mapping relationship.

The correction unit 603 is used for correcting the magnitude of the magnetic resonance signal with the magnitude mapping relationship and/or correcting the phase of the magnetic resonance signal with the phase mapping relationship.

Based on the above discussion, an embodiment also provides a magnetic resonance imaging system.

Figure 7:
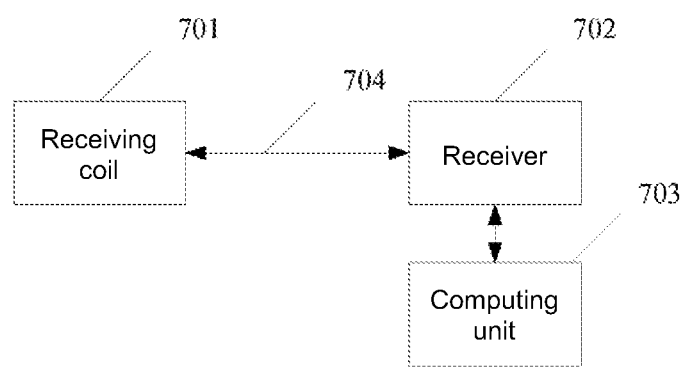
FIG. 7 is a structural diagram of one embodiment of a magnetic resonance imaging system.

FIG. 7 is a structural diagram of a magnetic resonance imaging system according to an embodiment.

As shown in FIG. 7, the magnetic resonance imaging system includes a receiving coil 701, a receiver 702, and a computing unit 703. A radio frequency receiving channel 704 is formed between the receiving coil 701 and the receiver 702. The receiver 702 is used for receiving a test signal group through the radio frequency receiving channel 704. The test signal group includes at least two test signals having a sending value, respectively. The receiver 702 is also used for recording a receiving value of each test signal. The computing unit 703 is used for establishing a signal mapping relationship of the radio frequency receiving channel according to the sending value and the receiving value of each test signal. The receiving coil 701 is used for acquiring a human body magnetic resonance signal and sending same to the receiver 702 through the radio frequency receiving channel 704. The receiver 702 is further used for receiving the magnetic resonance signal from the receiving coil 701 through the radio frequency receiving channel 704. The computing unit 703 is further used for correcting the magnetic resonance signal with the signal mapping relationship.

In practice, the radio frequency receiving channel correction method provided in the embodiments may be specifically implemented in various forms.

For example, an application program interface following certain specifications may write the magnetic resonance signal correction method as a plug-in program in a computing unit, and may also package the same as an application program that may be downloaded and used by a user. When written as a plug-in program, the plug-in program may be implemented as various plug-in forms such as ocx, dll, and cab. The magnetic resonance signal correction method provided in the embodiments may also be implemented by specific techniques, such as Flash plug-in, RealPlayer plug-in, MMS plug-in, MI staff plug-in, and ActiveX plug-in.

The magnetic resonance signal correction method provided in the embodiments may be stored in various storage media (e.g., a non-transitory computer-readable storage medium) in a storage manner of instruction storage or instruction set storage. The storage media include, but are not limited to, floppy disk, optical disk, DVD, hard disk, NAND flash, U disk, CF card, SD card, MMC card, SM card, memory stick, xD card, etc.

The magnetic resonance signal correction method provided in the embodiments may also be applied to storage medium based on NAND flash such as, for example, U disk, CF card, SD card, SDHC card, MMC card, SM card, memory stick, xD card, etc.

In one or more of the present embodiments, a magnetic resonance signal is received through a radio frequency receiving channel, and the magnetic resonance signal is corrected with a signal mapping relationship of the radio frequency receiving channel. Thus, the embodiments may be used to describe the signal receiving attributes of a radio frequency receiving channel based on a signal mapping relationship of the radio frequency receiving channel determined by a test signal, and correct a magnetic resonance signal through the signal mapping relationship. Thereby, the linear features of the radio frequency receiving channel may be optimized, the non-linear features of the channel may be reduced, and the imaging quality of a magnetic resonance image may be improved.

The above merely describes embodiments, and the embodiments are not intended to limit the scope of protection of the present invention. Any modifications, equivalent replacements and improvements within the spirit and principle of the present invention are covered in the scope of protection of the present invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance signal correction method comprising:
    setting a radio frequency receiving channel;
    setting a radio frequency signal transmitter at a sending end of the radio frequency receiving channel;
    setting a radio frequency signal receiver at a receiving end of the radio frequency receiving channel;
    sending, via the radio frequency signal transmitter, a test signal through the radio frequency receiving channel, wherein the test signal has a sending value;
    detecting, via the radio frequency signal receiver, the test signal through the radio frequency receiving channel avoiding deterioration of non-linear features and without amplification in the radio frequency receiving channel, wherein the test signal has a receiving value;
    generating a signal mapping relationship between the test signal receiving value and the test signal sending value;
    receiving a magnetic resonance signal through the radio frequency receiving channel; and
    correcting the magnetic resonance signal with the signal mapping relationship.

2. The magnetic resonance signal correction method of claim 1, wherein the signal mapping relationship is a signal mapping relationship storage table,
    wherein the signal mapping relationship storage table correspondingly stores the receiving value and the sending value of each test signal, and
    wherein correcting the magnetic resonance signal with the signal mapping relationship comprises:
        retrieving a test signal receiving value identical with a receiving value of the magnetic resonance signal from the signal mapping relationship storage table; and
        querying a test signal sending value corresponding to the test signal receiving value with the signal mapping relationship storage table.

3. The magnetic resonance signal correction method of claim 1, wherein the signal mapping relationship is a signal mapping relationship function,
    wherein the signal mapping relationship function defines a correlation between the receiving value and the sending value of each test signal, and
    wherein correcting the magnetic resonance signal with the signal mapping relationship comprises:
        calculating a sending value of the magnetic resonance signal corresponding to a receiving value of the magnetic resonance signal according to the signal mapping relationship function.

4. The magnetic resonance signal correction method of claim 1, further comprising:
    receiving an assessment signal group through the radio frequency receiving channel, wherein the assessment signal group includes at least two assessment signals having sending values, and recording a receiving value of each assessment signal;
    obtaining a correction value of each assessment signal, the obtaining comprising correcting the receiving value of each assessment signal with the signal mapping relationship; and
    determining a deviation value between the correction value of each assessment signal and the corresponding sending value, and sending an alarm prompt message when a maximum deviation value is greater than a preset standard value.

5. The magnetic resonance signal correction method of claim 1, wherein the signal mapping relationship of the radio frequency receiving channel comprises a magnitude mapping relationship, a phase mapping relationship, or the magnitude mapping relationship and the phase mapping relationship, and
    wherein correcting the magnetic resonance signal with the signal mapping relationship comprises correcting the magnitude of the magnetic resonance signal with the magnitude mapping relationship, correcting the phase of the magnetic resonance signal with the phase mapping relationship, or a combination thereof.

6. The magnetic resonance signal correction method of claim 1, further comprising:
    receiving a test signal group through the radio frequency receiving channel, wherein the test signal group includes at least two test signals having a sending value, respectively, and recording a receiving value of each test signal; and
    establishing the signal mapping relationship of the radio frequency receiving channel according to the sending value and the receiving value of each test signal.

7. The magnetic resonance signal correction method of claim 6, wherein establishing the signal mapping relationship of the radio frequency receiving channel comprises:
    setting a signal mapping relationship storage table, wherein the signal mapping relationship storage table correspondingly stores the receiving value and the sending value of each test signal;
    or fitting a signal mapping relationship function, wherein the signal mapping relationship function defines a correlation between the receiving value and the sending value of each test signal.

8. The magnetic resonance signal correction method of claim 6, wherein the test signal is a Sinc function.

9. A magnetic resonance signal correction apparatus comprising:
    a radio frequency signal transmitter at a sending end of a radio frequency receiving channel, wherein the radio frequency signal transmitter is configured to send a test value through the radio frequency receiving channel, and wherein the test value has a sending value;
    a magnetic resonance signal receiving unit configured to:
        detect the test signal through the radio frequency receiving channel avoiding deterioration of non-linear features and without amplification in the radio frequency receiving channel, wherein the test signal has a receiving value; and
        receive a magnetic resonance signal through a radio frequency receiving channel; and
    a correction unit configured to;
        generate a signal mapping relationship between the test signal receiving value and the test signal sending value; and
        correct the magnetic resonance signal with the signal mapping relationship.

10. The magnetic resonance signal correction apparatus of claim 9, wherein the signal mapping relationship is a signal mapping relationship storage table,
    wherein the signal mapping relationship storage table correspondingly stores the receiving value and the sending value of each test signal, and
    wherein the correction unit is configured to:
        retrieve a test signal receiving value identical with a receiving value of the magnetic resonance signal from the signal mapping relationship storage table; and query a test signal sending value corresponding to the test signal receiving value with the signal mapping relationship storage table.

11. The magnetic resonance signal correction apparatus of claim 9, wherein the signal mapping relationship is a fitted signal mapping relationship function, the fitted signal mapping relationship function defining a correlation between the receiving value and the sending value of each test signal, and
wherein the correction unit is configured to calculate a sending value of the magnetic resonance signal corresponding to a receiving value of the magnetic resonance signal according to the signal mapping relationship function.

12. The magnetic resonance signal correction apparatus of claim 9, further comprising an assessment unit configured to:
receive an assessment signal group through the radio frequency receiving channel, wherein the assessment signal group includes at least two assessment signals having sending values;
record a receiving value of each assessment signal;
correct the receiving value of each assessment signal with the signal mapping relationship, to obtain a correction value of each assessment signal;
determine a deviation value between the correction value of each assessment signal and the corresponding sending value; and
send an alarm prompt message when a maximum deviation value is greater than a preset standard value.

13. The magnetic resonance signal correction apparatus of claim 9, wherein the signal mapping relationship of the radio frequency receiving channel comprises a magnitude mapping relationship, a phase mapping relationship, or the magnitude mapping relationship and the phase mapping relationship, and
wherein the correction unit is configured to correct the magnitude of the magnetic resonance signal with the magnitude mapping relationship, correct the phase of the magnetic resonance signal with the phase mapping relationship, or correct the magnitude of the magnetic resonance signal with the magnitude mapping relationship and correct the phase of the magnetic resonance signal with the phase mapping relationship.

14. The magnetic resonance signal correction apparatus of claim 9, wherein the magnetic resonance signal receiving unit is configured to:
receive a test signal group through the radio frequency receiving channel, wherein the test signal group includes at least two test signals having a sending value, respectively; and
record a receiving value of each test signal, and
wherein the correction unit is configured to establish the signal mapping relationship of the radio frequency receiving channel according to the sending value and the receiving value of each test signal.

15. The magnetic resonance signal correction apparatus of claim 14, wherein the correction unit is configured to:
set a signal mapping relationship storage table, wherein the signal mapping relationship storage table correspondingly stores the receiving value and the sending value of each test signal; or
fit a signal mapping relationship function, wherein the signal mapping relationship function defines a correlation between the receiving value and the sending value of each test signal.

16. A magnetic resonance imaging system comprising:
a receiving coil;
a receiver; and
a computer,
wherein a radio frequency receiving channel is formed between the receiving coil and the receiver, wherein the receiver is configured to:
receive a test signal group through the radio frequency receiving channel avoiding deterioration of non-linear features and without amplification in the radio frequency receiving channel, the test signal group including at least two test signals having a sending value, respectively; and
record a receiving value of each test signal,
wherein the computer is configured to establish a signal mapping relationship of the radio frequency receiving channel according to the sending value and the receiving value of each test signal,
wherein the receiver is further configured to receive a magnetic resonance signal from the receiving coil through the radio frequency receiving channel, and
wherein the computer is further configured to correct the magnetic resonance signal with the signal mapping relationship.

* * * * *